(12) United States Patent
Hironaka et al.

(10) Patent No.: US 10,274,517 B2
(45) Date of Patent: Apr. 30, 2019

(54) CONDUCTIVE PROBE FOR INSPECTION AND SEMICONDUCTOR INSPECTION DEVICE

(71) Applicant: NHK SPRING CO., LTD., Yokohama-shi, Kanagawa (JP)

(72) Inventors: Kohei Hironaka, Kamiina-gun (JP); Kazuya Souma, Kamiina-gun (JP); Satoshi Shoji, Kamiina-gun (JP); Ryosuke Yamaguchi, Kamiina-gun (JP)

(73) Assignee: NHK SPRING CO., LTD., Yokohama-shi, Kanagawa (JP)

( * ) Notice: Subject to any disclaimer, the term of this patent is extended or adjusted under 35 U.S.C. 154(b) by 0 days.

(21) Appl. No.: 15/576,605

(22) PCT Filed: Feb. 1, 2017

(86) PCT No.: PCT/JP2017/003586
§ 371 (c)(1),
(2) Date: Nov. 22, 2017

(87) PCT Pub. No.: WO2017/141706
PCT Pub. Date: Aug. 24, 2017

(65) Prior Publication Data
US 2018/0238932 A1 Aug. 23, 2018

(30) Foreign Application Priority Data
Feb. 15, 2016 (JP) .................. 2016-026041

(51) Int. Cl.
*G01R 31/28* (2006.01)
*G01R 1/067* (2006.01)
*G01R 31/26* (2014.01)
(52) U.S. Cl.
CPC ......... *G01R 1/06738* (2013.01); *G01R 1/067* (2013.01); *G01R 31/2601* (2013.01)

(58) Field of Classification Search
CPC . G01L 5/0061; G01L 9/0002; G01R 1/07307; G01R 1/07314; G01R 31/2891;
(Continued)

(56) References Cited

U.S. PATENT DOCUMENTS

| 4,174,148 A * | 11/1979 | Obuch ............... H01R 4/34 439/782 |
| 4,417,206 A | 11/1983 | Stowers |
| 4,571,540 A | 2/1986 | Stowers et al. |
| 6,759,858 B2 * | 7/2004 | Roggel .............. G01R 1/06738 324/754.2 |
| 9,702,905 B2 | 7/2017 | Yamada et al. |

FOREIGN PATENT DOCUMENTS

| JP | 58-96259 U | 6/1983 |
| JP | 61-79273 U | 5/1986 |

(Continued)

OTHER PUBLICATIONS

International Search Report dated Apr. 11, 2017 for PCT/JP2017/003586, citing the above reference(s).
(Continued)

*Primary Examiner* — Vinh P Nguyen
(74) *Attorney, Agent, or Firm* — Hauptman Ham, LLP

(57) ABSTRACT

Provided is a conductive probe having a first end portion and a second end portion opposing the first end portion. The first end portion includes first to fourth linear ridges and first to fifth vertexes, and the first to fourth linear ridges are spaced from one another and arranged to form a cross. The first to fourth vertexes are located on an outer circumference of the first end portion and further arranged between the first linear ridge and the second linear ridge, between the second linear ridge and the third linear ridge, between the third linear ridge and the fourth linear ridge, and between the fourth linear ridge and the first linear ridge, respectively.

14 Claims, 11 Drawing Sheets

(58) Field of Classification Search
CPC .... G01R 1/06738; G01R 3/00; G01R 1/0735; G01R 1/06733; G01R 31/2887; G01R 31/2889; G01R 1/0416; G01R 1/06744; G01R 1/04; G01R 1/06722; G01R 1/0466; G01R 1/0483; G01R 1/06705; G01R 1/06711; G01R 1/07357; G01R 1/07378; G01R 27/2605; G01R 15/125; G01R 19/155; G01R 19/2503; G01R 1/0408; G01R 1/0425; G01R 1/06716; G01R 1/0675; G01R 1/0677; G01R 1/073; G01R 1/28; G01R 31/045; G01R 31/2601; G01R 31/2886; G01R 35/005; G01R 15/165; G01R 19/145; G01R 19/165; G01R 1/00; G01R 1/06; G01R 1/06727; G01R 1/07342; G01R 1/07392; G01R 31/2829; G01R 31/2849; G01R 31/2884; G01R 31/2893; G01R 31/327; G01R 1/067; G01R 1/06772; G01R 1/06788; G01R 31/2818; H01R 11/22; H01R 2103/00; H01S 5/0014

See application file for complete search history.

(56) References Cited

FOREIGN PATENT DOCUMENTS

| | | |
|---|---|---|
| JP | H10-214649 A | 8/1998 |
| JP | 2000-329789 A | 11/2000 |
| JP | 2008-157904 A | 7/2008 |
| JP | 2009-198238 A | 9/2009 |
| JP | 2013-130516 A | 7/2013 |
| JP | 2014-085207 A | 5/2014 |
| JP | 5783715 B2 | 9/2015 |
| WO | 2013/018809 A1 | 2/2013 |

OTHER PUBLICATIONS

Japanese Notice of Allowance dated Oct. 19, 2017 corresponding to Japanese Application No. 2017-539049, citing the above reference(s).

English Translation of Written Opinion of the International Searching Authority for corresponding International application No. PCT/JP2017/003586 dated Apr. 11, 2017.

* cited by examiner

CONDUCTIVE PROBE FOR INSPECTION AND SEMICONDUCTOR INSPECTION DEVICE

CROSS REFERENCE TO RELATED APPLICATION

This application claims the priority of Japanese Patent Application No. 2016-026041, filed on Feb. 15, 2016, in the JPO (Japanese Patent Office). Further, this application is the National Phase Application of International Application No. PCT/JP2017/003586, filed on Feb. 1, 2017, which designates the United States and was published in Japan. Both of the priority documents are hereby incorporated by reference in their entireties.

TECHNICAL FIELD

The present invention relates to an inspection device. For example, the present invention relates to a conductive probe (needle-shaped probe) for inspecting an electronic part having a circuit utilizing a semiconductor, such as a semiconductor integrated circuit and a display device, or an electronic device including the part and to a semiconductor inspection device having the conductive probe.

BACKGROUND ART

A semiconductor integrated circuit is utilized in almost all electronic parts and electronic devices (hereinafter, they are collectively referred to as electric parts), and is manufactured by forming and processing a number of thin films (e.g., insulating films, conductive films, semiconductor films) over a semiconductor substrate. A display device typified by a liquid crystal display device, an EL (Electroluminescence) display device, and the like is also a kind of an electronic part. Similar to a semiconductor integrated circuit, a display device is also manufactured through a number of thin-film formation processes while there is a difference therebetween in that a display device is manufactured over a glass substrate or a plastic substrate.

Thin-film formation processes are conducted under an environment where entrance of foreign objects is strictly prohibited. However, it is difficult to completely suppress damage to a substrate and a circuit and generation of patterning failure because several hundred processes are included in the thin-film formation processes. Therefore, it is necessary to inspect a variety of properties of electronic parts in order to prevent mixture of defective products.

An inspection device called a semiconductor inspection device is generally used when electric properties of electronic parts are inspected. In this inspection, an electrode or a wiring formed over a semiconductor integrated circuit is contacted with a tip of a fine needle-shaped electrode called a conductive probe to obtain a variety of electronic information. The size of an electrode and wiring depends on the semiconductor integrated circuit and may approximate a region of a hundred and several ten micrometers squares in the case of a miniaturized circuit. Therefore, it is important to certainly make a conductive probe electrically contact with an electrode or wiring with such a small area to perform an accurate inspection.

Additionally, an electrode and wiring are not always arranged horizontally, and their shapes are not limited to a plane. For example, when a package equipped with a semiconductor chip in which a semiconductor integrated circuit is fabricated is subjected to measurement, a lead terminal extending from the package may have a bent structure. Moreover, a solder ball formed over the package may be used as an electrode for inspection. Hence, conductive probes with a variety of tip shapes for reliable electrical contact with an electrode and wiring have been known.

CITATION LIST

Patent Literature

Patent Literature 1: Japanese Laid Open Patent No. 2000-329789
Patent Literature 2: Japanese Laid Open Patent No. 2008-157904
Patent Literature 3: International Application Publication No. WO2013/018809
Patent Literature 4: Japanese Patent No. 5783715
Patent Literature 5: Japanese Laid Open Patent No. 2009-198238

SUMMARY OF INVENTION

Technical Problem

An object of the present invention is to provide a conductive probe capable of certainly achieving electrical contact with an electrode or wiring of a semiconductor integrated circuit as an inspection object or an electronic part including the same. An object of the present invention is to provide a conductive probe excellent in durability such as durability of an end portion which makes contact with an electrode or wiring. An object of the present invention is to provide a conductive probe capable of reducing the necessity of considering a shape of an electrode or wiring when the conductive probe is disposed in a conductive probe unit. An object of the present invention is to provide a conductive probe unit having one or more of the conductive probes or a semiconductor inspection device having the same.

Solution to Problem

An embodiment of the present invention is a conductive probe having a first end portion and a second end portion opposing the first end portion. The first end portion has first to fourth linear ridges and first to fifth vertexes, and the first to fourth linear ridges are spaced from one another and arranged to form a cross. The first to fourth vertexes are located on an outer circumference of the first end portion and further arranged between the first linear ridge and the second linear ridge, between the second linear ridge and the third linear ridge, between the third linear ridge and the fourth linear ridge, and between the fourth linear ridge and the first linear ridge, respectively.

The first to fourth linear ridges may be parallel to a direction of a radius of the conductive probe. Additionally, the first to fourth linear ridges may exist in the same plane as the fifth vertex.

The fifth vertex may be located at a cross point of the cross. Alternatively, the fifth vertex may exist in a plane the same as or different from that formed by the first to fourth vertexes.

In a direction parallel to an axis of the conductive probe, a distance from the fifth vertex to the second end portion may be smaller than a distance from each of the first to fourth linear ridges to the second end portion.

In a direction parallel to an axis of the conductive probe, a distance from each of the first to fourth vertexes to the second end portion may be smaller than a distance from each of the first to fourth linear ridges to the second end portion Each of the first to fourth linear ridges may be shorter than a radius of the conductive probe.

The first to fourth vertexes may exist on the outer circumference of the conductive probe.

Each of the first to fourth linear ridges may reach the outer circumference of the conductive probe.

The first to fourth linear ridges may exist in the same plane as the first to fourth vertexes, and the plane may be parallel to a direction of the radius.

An embodiment of the present invention is a conductive probe unit having the conductive probe.

An embodiment of the present invention is a semiconductor inspection device having the conductive probe unit.

DESCRIPTION OF EMBODIMENTS

Hereinafter, the embodiments of the present invention are explained with reference to the drawings. The invention can be implemented in a variety of different modes within its concept and should not be interpreted only within the disclosure of the embodiments exemplified below.

The drawings may be illustrated so that the width, thickness, shape, and the like are illustrated more schematically compared with those of the actual modes in order to provide a clearer explanation. However, they are only an example, and do not limit the interpretation of the invention. In the specification and the drawings, the same reference number is provided to an element that is the same as that which appears in preceding drawings, and a detailed explanation may be omitted as appropriate.

In the present specification and the scope of claims, an expression that a plurality of straight lines or points exists in the same plane means that they exist between two planes close to each other and includes not only a case where they exist in entirely the same plane but also a case where they exist in approximately the same or substantially the same plane. Furthermore, when vectors of a plurality of straight lines intersect a plane at an angle equal to or smaller than 3°, these straight lines are defined as existing in the same plane.

First Embodiment

1. Structure of Semiconductor Inspection Device

Figure 1A:
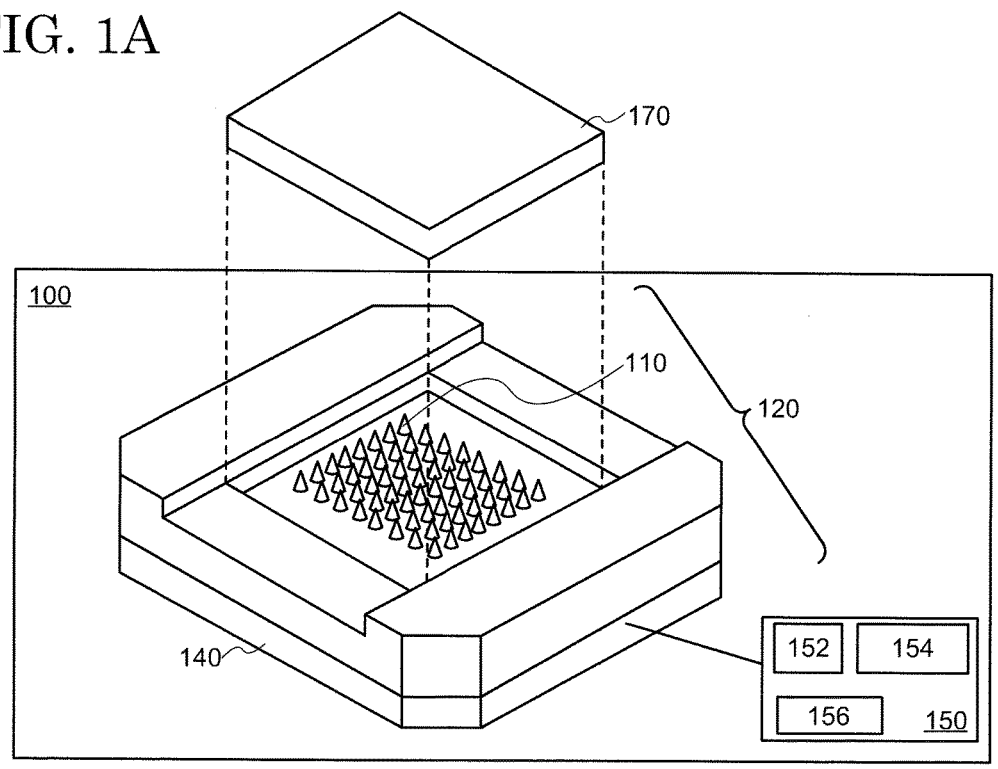
FIG. 1A A perspective view of a semiconductor inspection device according to an embodiment of the present invention.

FIG. 1A is a schematic view showing a structure of a semiconductor inspection device according to the First Embodiment of the present invention. The semiconductor inspection device 100 has a conductive probe unit 120 and conductive probes 110 installed in the conductive probe unit 120. One or more conductive probes 110 may be installed, and a plurality of (e.g., several tens to several thousand) conductive probes 110 are usually disposed. The conductive probes 110 receive and transmit electric signals from and to a circuit substrate 140. Note that the circuit substrate 140 is connected to a tester 150 in FIG. 1A. Units such as a measurement-power source 152, a LCR measuring instrument 154, a pulse generator 156, and the like are included in the tester 150.

Figure 1B:
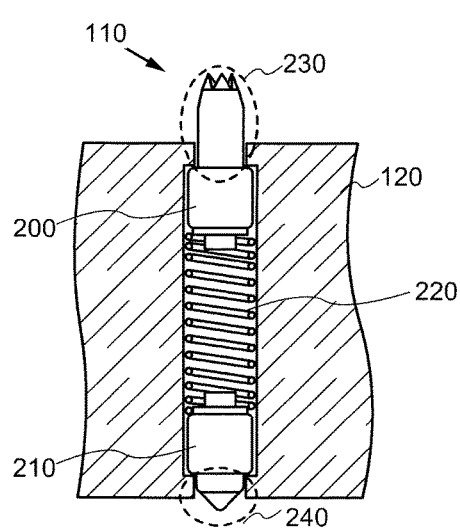
FIG. 1B A cross-sectional view of a conductive probe according to an embodiment of the present invention.

FIG. 1B is a schematic cross-sectional view of the conductive probe 110 and the conductive probe unit 120 shown in FIG. 1A. As illustrated in FIG. 1B, the conductive probe 110 is disposed in the conductive probe unit 120, and an end portion (first end portion 230) is exposed therefrom. This first end portion 230 makes contact with an electrode or wiring of an inspection object 170 to measure electric properties. An integrated circuit formed over a semiconductor device, an IC package in which an integrated circuit is packaged, and the like are exemplified as an inspection object 170. Note that a second end portion opposing the first end portion 230 is item 240.

The conductive probe unit 120 is formed by using an insulator such as a resin and ceramics. The plurality of conductive probes 110 are arranged so that they have the same height. Their arrangement may be determined according to a pattern of an electrode or wiring of an inspection object. The conductive probe 110 includes a conductive material exemplified by a metal such as gold, copper, nickel, palladium, and tungsten or an alloy of these metals. Alternatively, the conductive probe 110 may include a conductive material, and a surface thereof may be subjected to plating processing by using gold and so forth.

The conductive probe 110 possesses a first plunger 200 and a second plunger 210. The first plunger 200 undergoes electrical connection with an electrode or wiring of an inspection object 170 at its terminal, that is, at the first end portion 230. It is preferred that the first and second plungers 200 and 210 have a columnar shape, and the following explanation is provided for a case of having a columnar shape in the present embodiment.

A coil spring 220 is further provided to the conductive probe unit 120, and expansion and contraction of the coil spring 220 in an axis direction reduces an impact to the inspection object 170 when the first end portion 230 of the conductive probe 110 makes contact with an electrode and wiring of the inspection object 170.

2. Structure of Tip Portion of Conductive Probe

Figure 2:
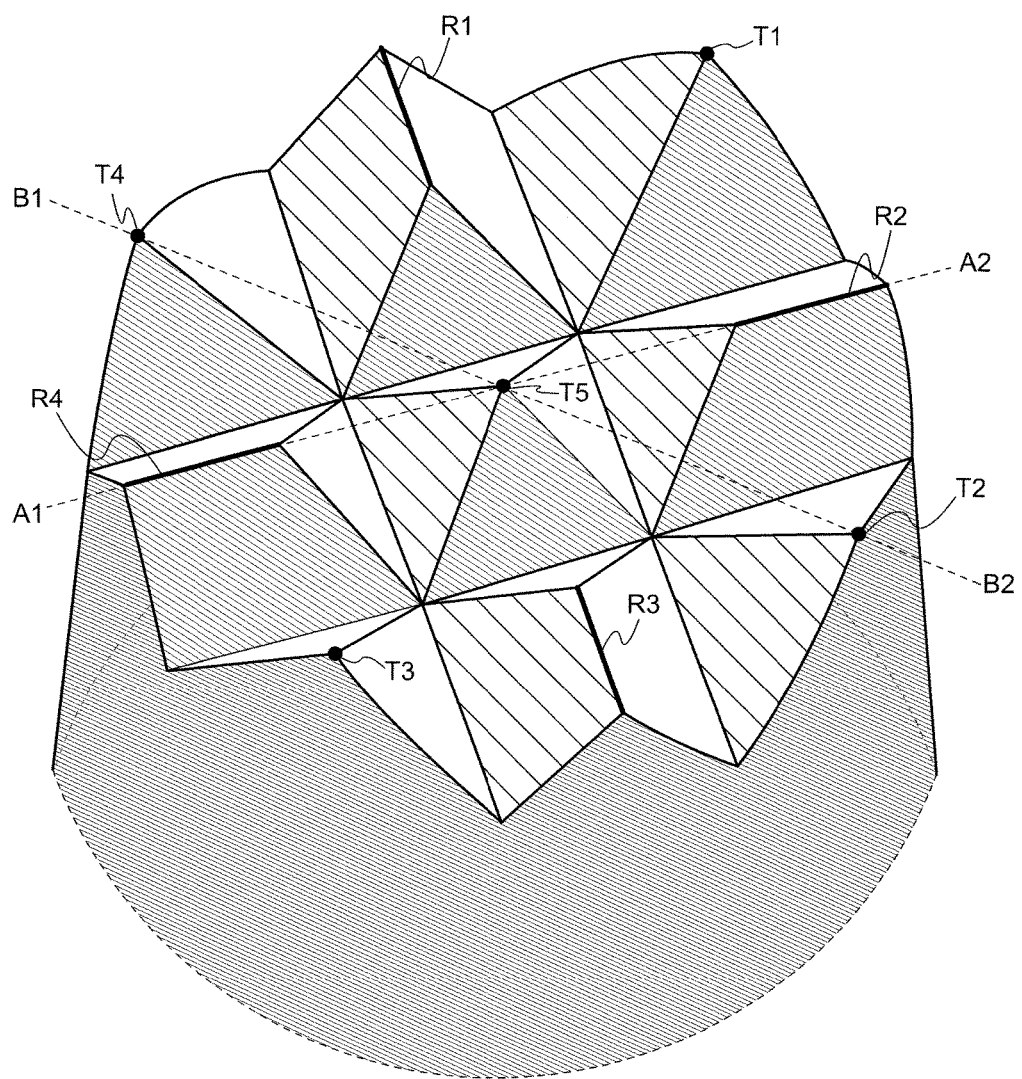
FIG. 2 A perspective view of a conductive probe according to an embodiment of the present invention.

FIG. 2 shows a perspective view of the first end portion 230 of the conductive probe 110. As shown in FIG. 2, the first end portion 230 has four linear ridges (first to fourth linear ridges) R1 to R4 illustrated with bold lines in the drawing as well as five vertexes (first to fifth vertexes) T1 to T5.

Figure 3A:
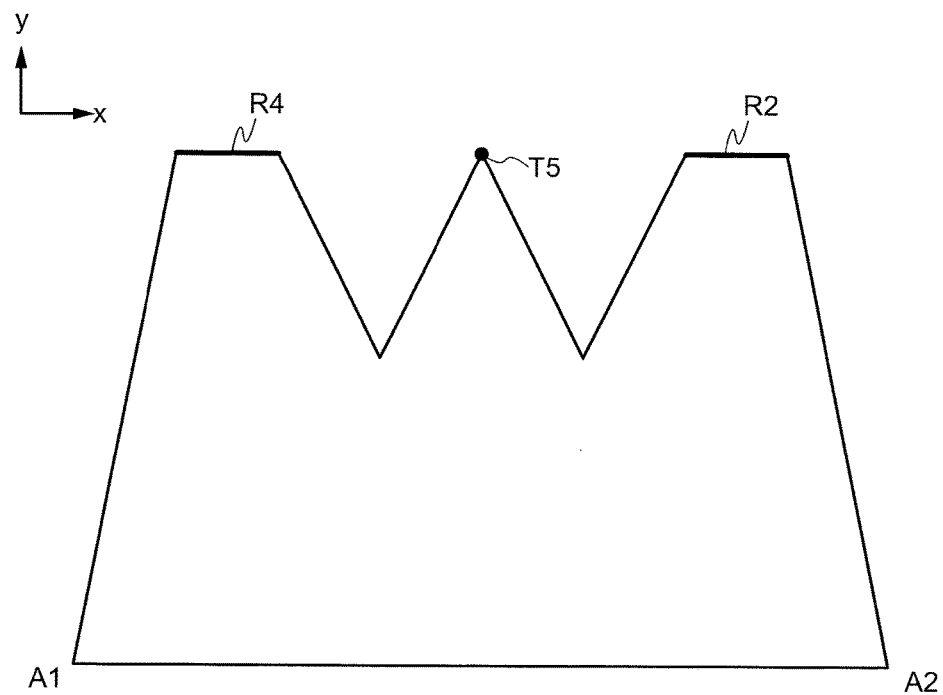
FIG. 3A A cross-sectional view of a conductive probe according to an embodiment of the present invention.
Figure 3B:
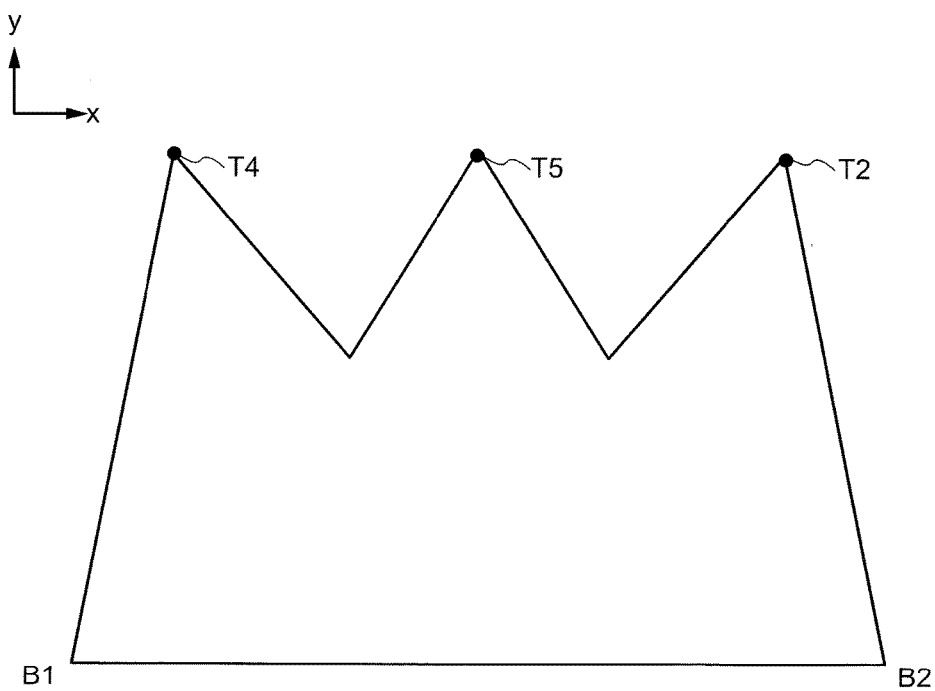
FIG. 3B A cross-sectional view of a conductive probe according to an embodiment of the present invention.

FIG. 3A and FIG. 3B are respectively cross-sectional views along dotted lines A1-A2 and B1-B2 illustrated in FIG. 2. As shown in FIG. 2 and FIG. 3A, the first to fourth linear ridges R1 to R4 exist in the same plane as one another and are spaced from one another. Their directions are parallel to a radius direction (x-axis direction in the drawing) of the conductive probe 110. That is, the first to fourth linear ridges R1 to R4 radially extend to a center axis of the conductive probe which is parallel to a direction indicated by a y-axis in the drawing. In the present embodiment, the first to fourth linear ridges R1 to R4 are formed to give a cross. Namely, the first linear ridge R1 and the third linear ridge R3 exist on the same straight line (first straight line), while the second linear ridge R2 and the fourth linear ridge R4 exist on the same straight line (second straight line), where the first straight line and the second straight line perpendicularly intersect each other. Note that an angle between the first straight line and the second straight line is not limited to perpendicular and may be determined at an arbitral angle.

As shown in FIG. 2 and FIG. 3B, the first to fourth vertexes T1 to T4 exist in the same plane. The plane is parallel to the radius direction of the conductive probe. In the present embodiment, the fifth vertex T5 also exists in the plane. That is, all of the first vertex T1 to the fifth vertex T5 exist in the same plane. Moreover, the fifth vertex T5 is located at a cross point of the straight line (first straight line) passing through the first linear ridge R1 and the third linear ridge R3 and the straight line (second straight line) passing through the second linear ridge R2 and the fourth linear ridge R4.

Note that, as shown in FIG. 1B, FIG. 3A, and FIG. 3B, a diameter of the first end portion 230 decreases as approaching a tip thereof in a direction towards the tip, and the linear ridges R1 to R4 and the vertexes T1 to T5 are provided at the tip. That is, the linear ridges R1 to R4 and the vertexes T1 to T5 are formed inside a cross section of the first end portion 230 at a portion having the maximum diameter.

In the present embodiment, an example is described where all of the first vertex T1 to the fifth vertex T5 exist in the same plane. However, the embodiments of the present invention are not limited thereto, and the fifth vertex T5 may exist outside the plane formed by the other vertexes T1 to T4, for example. Furthermore, all of the first to fifth vertexes T1 to T5 exist in the plane which is the same as the plane formed by the first to fourth linear ridges R1 to R4 in the present embodiment. However, the embodiments of the present invention are not limited thereto, and only the fifth vertex may exist in the plane the same as the plane formed by the first to fourth linear ridges R1 to R4 whereas other vertexes may exist outside the plane. Additionally, the first end portion 230 decreases in diameter as approaching the tip in the direction towards the tip and the linear ridges R1 to R4 and the vertexes T1 to T5 are formed at the tip in the present embodiment. However, the embodiments of the present invention are not limited thereto, and the first end portion 230 may maintain the columnar shape until the tip, and the linear ridges R1 to R4 and the vertexes T1 to T5 may be formed at the tip. These embodiments will be described below.

The first end portion 230 having such a structure can be formed by using a rotary cutting tool when the first plunger 200 with a columnar shape is subjected to lathe processing, for example. In this case, the first to fourth linear ridges R1 to R4 are spaced from one another, and their lengths are shorter than that of the radius of the conductive probe 110. More specifically, the length of each of the linear ridges R1 to R4 is shorter than the maximum radius of the first plunger 200 including the first end portion 230. The length is preferably equal to or larger than 10 μm and equal to or smaller than 15% of the diameter of the tip portion of the first end portion 230. Furthermore, each of the first to fourth linear ridges R1 to R4 reaches the outer circumference of the conductive probe 110. Namely, each of the first to fourth linear ridges R1 to R4 extends in the direction to the center axis from the side surface of the first plunger 200 including the first end portion 230.

On the other hand, the first to fourth vertexes T1 to T4 are located on the side surface of the conductive probe 110. In other words, the first to fourth vertexes T1 to T4 are positioned on an outer circumference of the first plunger 200 including the first end portion 230.

The conductive probe 110 having such an end-portion shape is able to make contact with an electrode and wiring of an inspection object by using a plurality of lines as contact portions. For example, when the conductive probe makes contact with an electrode or wiring having a planar shape in a normal direction, all of the first to fourth linear ridges R1 to R4 contribute to the electrical contact. In the case where the fifth vertex T5 exists in the same plane including the first to fourth linear ridges R1 to R4, the fifth vertex T5 in addition to the first to fourth linear ridges R1 to R4 also contributes to the electrical contact. In contrast, the conductive probes disclosed by the patent literature 1, 4, and 5 each have a plurality of conic or pyramidal contact portions. In this case, contact with an electrode or wiring is performed with only a plurality of points. Therefore, employment of the end-portion shape of the present embodiment not only realizes a more reliable electrical contact but also prevents or reduces abrasion or a nick of the end portion of the conduct probe 110.

Additionally, even in a case where contact with an electrode or wiring is carried out in an inclined direction, at least two linear ridges can contribute to an electrical contact. On the other hand, the contact probe disclosed in the patent literature 2 has a single linear ridge at an end portion. In this case, an attempt to make contact in an inclined direction to an electrode or wiring results in contact using only one point. Hence, the use of the end-portion shape of the present embodiment enables a more reliable electrical contact with an inspection object.

Moreover, in the case where an end portion possesses a single linear ridge, a direction of the linear ridge during contact with an electrode or wiring significantly changes depending on the rotation about a center axis because the conduct probe possesses only a two-fold rotation axis (C2 axis: a rotation axis giving the same state by a rotation of 180°). Hence, it is necessary to arrange the conductive probe in a conductive probe unit so as to inhibit the rotation about the center axis, which requires a shape of opening portions formed in the conductive probe unit for receiving conductive probes to be elliptic or polygonal, for example. On the other hand, influence of the rotation about the center axis of the conductive probe is small, and it is not necessary to consider the rotation about the center axis when arranging the conductive probes in the conductive probe unit because the conductive probe according to the present embodiment has a four-fold rotation axis (C4 axis: a rotation axis giving the same state by a rotation of 90°). Hence, the opening portions can be formed so as to have a circular shape, which improves processability of the conductive probe unit.

Second Embodiment

Figure 4:
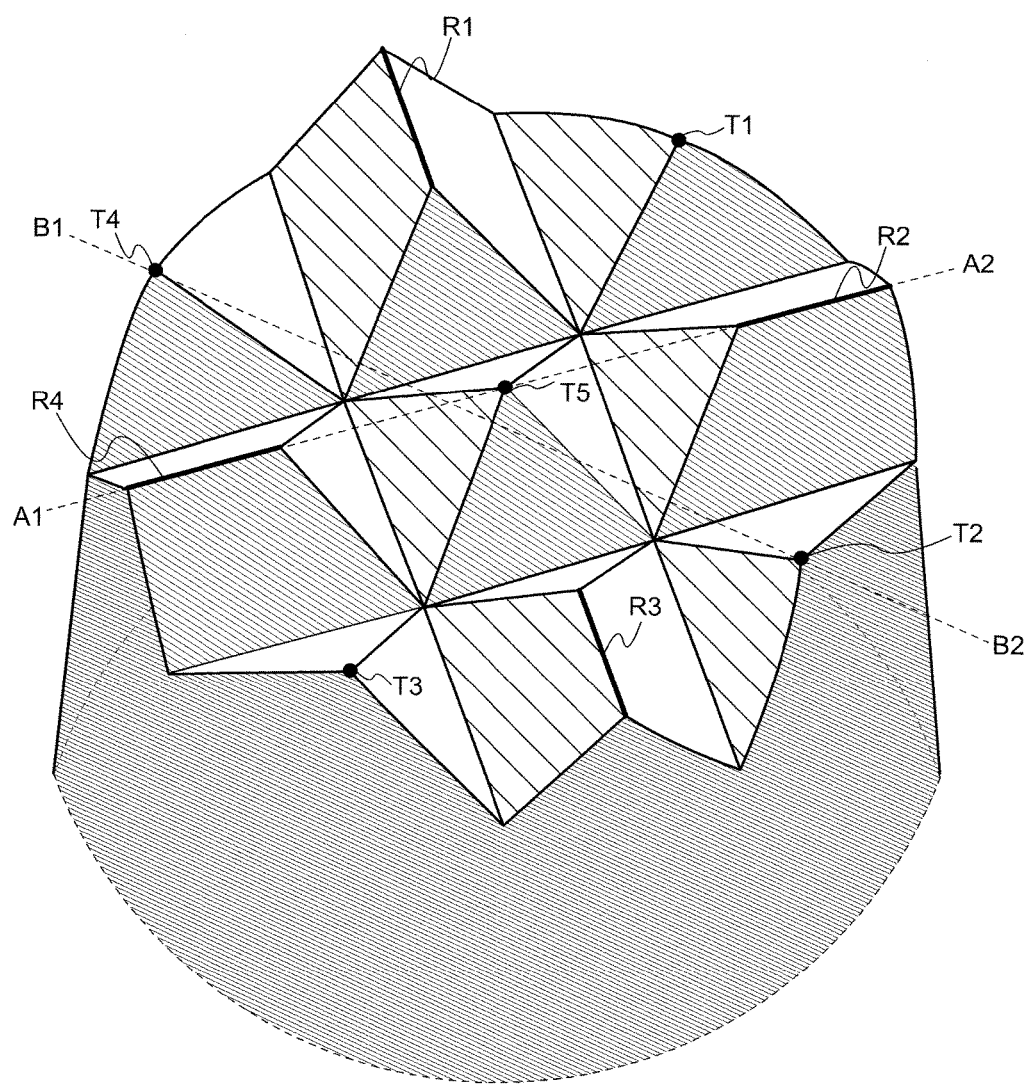
FIG. 4 A perspective view of a conductive probe according to an embodiment of the present invention.
Figure 5A:
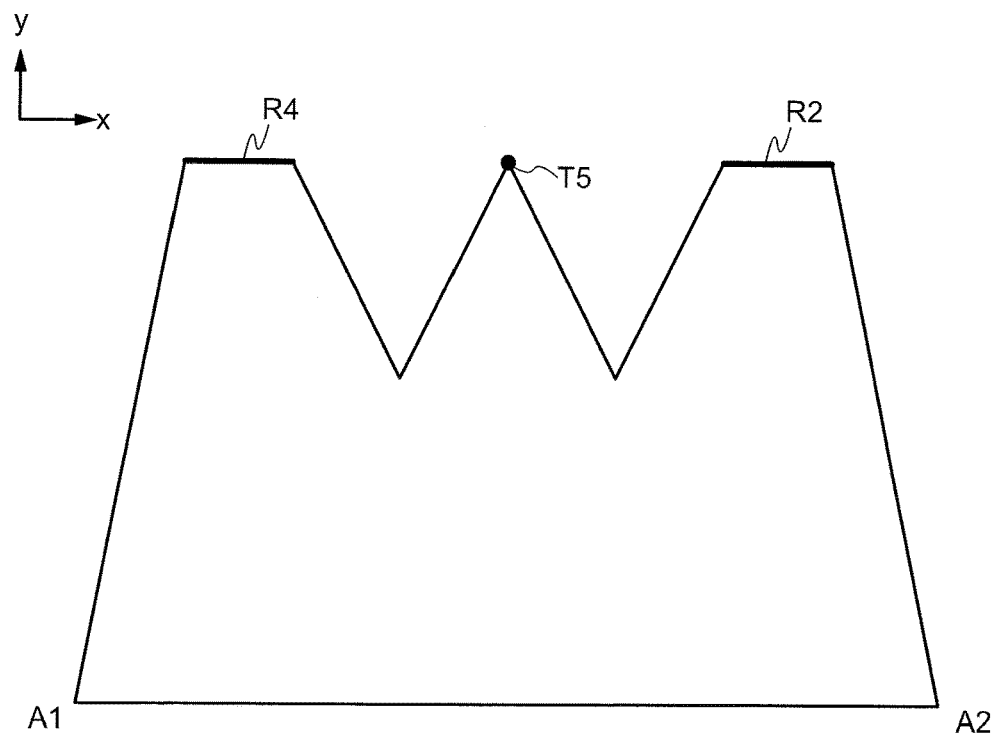
FIG. 5A A cross-sectional view of a conductive probe according to an embodiment of the present invention.
Figure 5B:
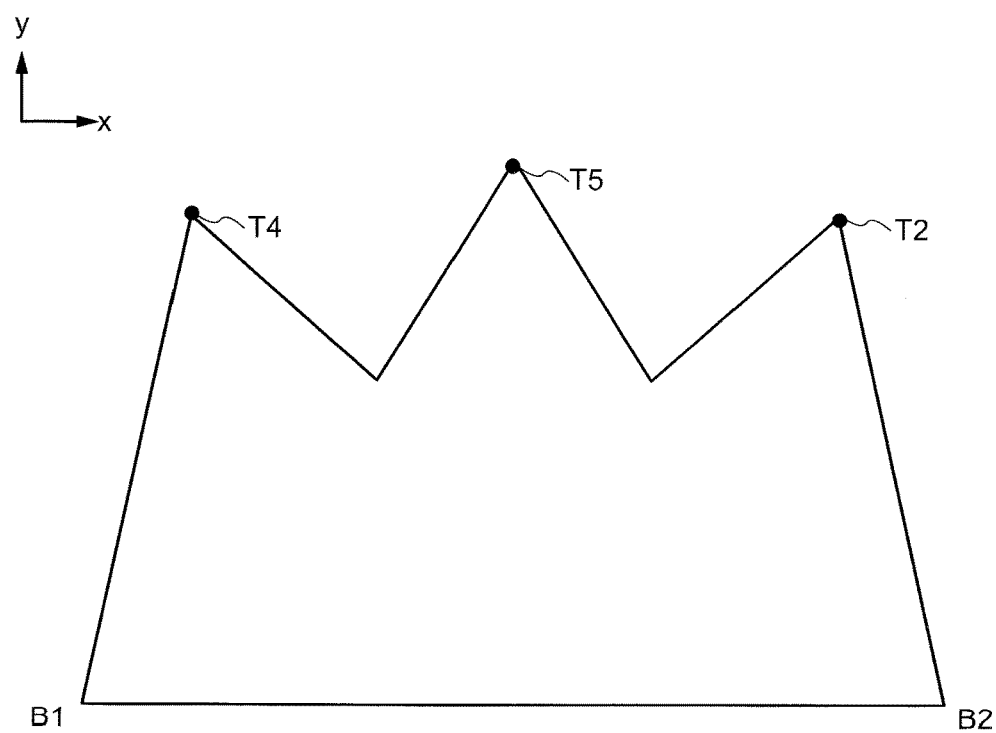
FIG. 5B A cross-sectional view of a conductive probe according to an embodiment of the present invention.

In the present embodiment, a conductive probe having an end-portion shape different from that of the First Embodiment is explained by using FIG. 4, FIG. 5A, and FIG. 5B. FIG. 4 is a perspective view of the end portion 230 of the conductive probe 110, and FIG. 5A and FIG. 5B are schematic cross-sectional views along dotted lines A1-A2 and B1-B2 shown in FIG. 4, respectively.

Similar to the First Embodiment, the first end portion 230 of the conductive probe 110 possesses four linear ridges (first to fourth linear ridges) R1 to R4 and five vertexes (first to fifth vertexes) T1 to T5. A difference from the First Embodiment is that, although the fifth vertex T5 exists in the same plane as the first to fourth linear ridges R1 to R4, the first to fourth vertexes T1 to T4 exist in a plane different from the aforementioned plane. More specifically, the fifth vertex T5 is located at the cross point of the straight line (first straight line) passing through the first linear ridge R1 and the third linear ridge R3 and the straight line passing through the second linear ridge R2 and the fourth linear ridge R4, whereas the first to fourth vertexes T1 to T4 are located closer to the second end portion 240. That is, the first to fourth vertexes T1 to T4 are placed at a lower position along the y-axis in the drawing. The structures other than the aforementioned structures are the same as those of the First Embodiment, and a detailed description thereof is omitted.

Similar to the First Embodiment, the conductive probe 110 having such an end-portion shape is also able to make contact with an electrode or wiring of an inspection object by using four straight lines and one point as contact portions which originate from the plurality of lines of the first to fourth linear ridges and the fifth vertex T5. Therefore, not only is a more reliable electrical contact feasible, but also abrasion or a nick of the end portion of the conduct probe 110 can be prevented or reduced. Additionally, the end-portion shape of the conduct probe of the present embodiment also has a C4 axis, which allows reduction of the necessity to consider the rotation about the center axis when arranged in the conductive probe unit and improves processability of the conductive probe unit.

Furthermore, when a sphere solder ball is used as an inspection electrode, an electrical contact can be achieved in a variety of contact modes although depending on a size of the solder ball. For example, an electrical contact can be achieved by using a point in the first linear ridge R1, the first vertex T1, and the fifth vertex T5. Hence, a more reliable electrical contact is feasible with an electrode or wiring of an inspection object.

Third Embodiment

Figure 6:
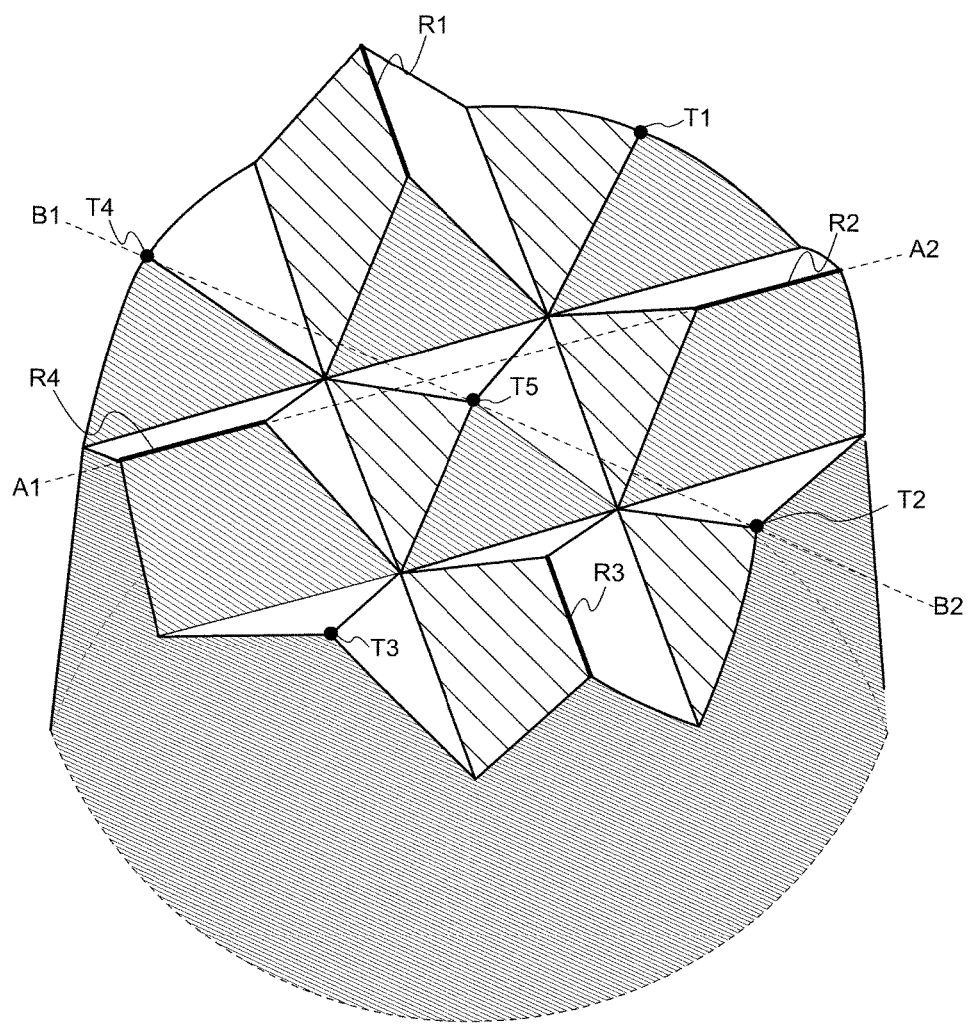
FIG. 6 A perspective view of a conductive probe according to an embodiment of the present invention.
Figure 7A:
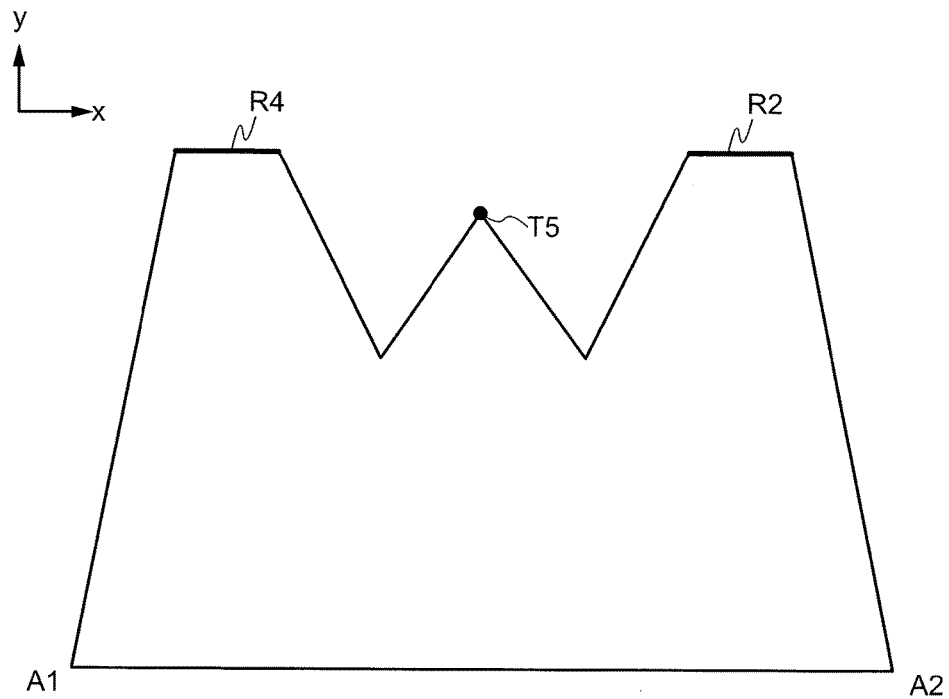
FIG. 7A A cross-sectional view of a conductive probe according to an embodiment of the present invention.
Figure 7B:
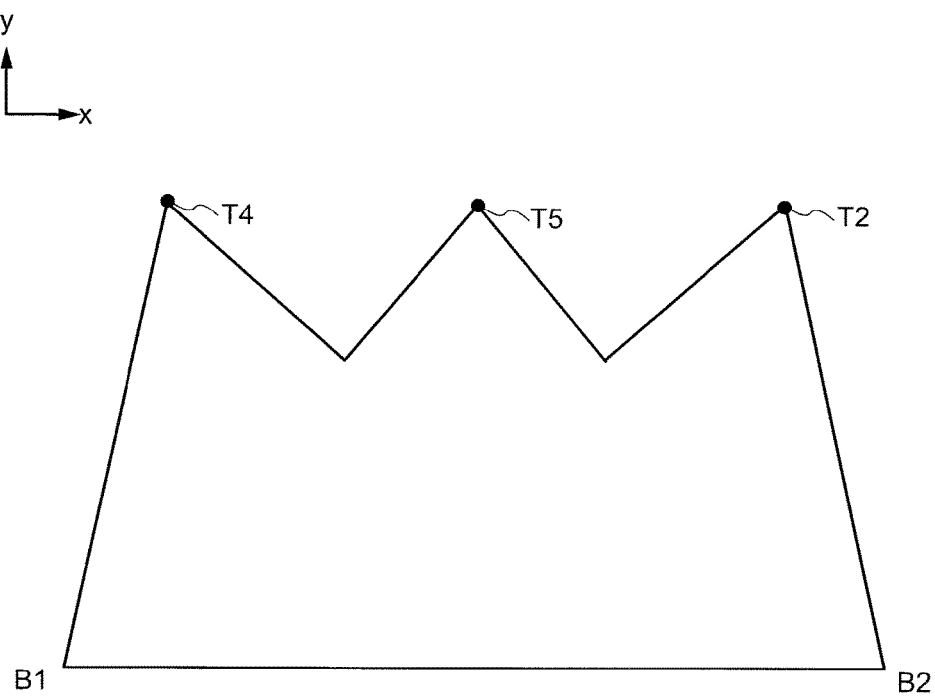
FIG. 7B A cross-sectional view of a conductive probe according to an embodiment of the present invention.

In the present embodiment, a conductive probe having an end-portion shape different from those of the First and Second Embodiments is explained by using FIG. 6, FIG. 7A, and FIG. 7B. FIG. 6 is a perspective view of the first end portion 230 of the conductive probe 110, and FIG. 7A and FIG. 7B are schematic cross-sectional views along dotted lines A1-A2 and B1-B2 shown in FIG. 6, respectively.

Similar to the First and Second Embodiments, the first end portion 230 of the conductive probe 110 possesses four linear ridges (first to fourth linear ridges) R1 to R4 and five vertexes (first to fifth vertexes) T1 to T5. A difference from the First and Second Embodiments is that, although the first to fifth vertexes T1 to T5 exist in the same plane, they are located on a plane different from a plane including the first to fourth linear ridges R1 to R4 and closer to the second end portion 240. That is, the first to fifth vertexes T1 to T5 are located at a lower position than the first to fourth linear ridges R1 to R4 in the y-axis direction. The structures other than the aforementioned structures are the same as those of the First Embodiment, and a detailed description thereof is omitted.

Similar to the First and Second Embodiments, the conductive probe 110 having such an end-portion shape is also able to make contact with an electrode or wiring of an inspection object by using four straight lines as contact portions originating from the plurality of lines of the first to fourth linear ridges. Therefore, not only is a more reliable electrical contact feasible, but also abrasion or a nick of the end portion of the conduct probe 110 can be prevented or reduced. Additionally, the end-portion shape of the conduct probe of the present embodiment also has a C4 axis, which allows reduction of the necessity to consider the rotation about the center axis when arranged in the conductive probe unit and improves processability of the conductive probe unit.

Furthermore, when a sphere solder ball is used as an inspection electrode, an electrical contact can be achieved with total four points derived from a point of each of the first to fourth linear ridges R1 to R4 although depending on a size of the solder ball. Hence, a more reliable electrical contact is feasible with an electrode or wiring of an inspection object.

Fourth Embodiment

Figure 8:
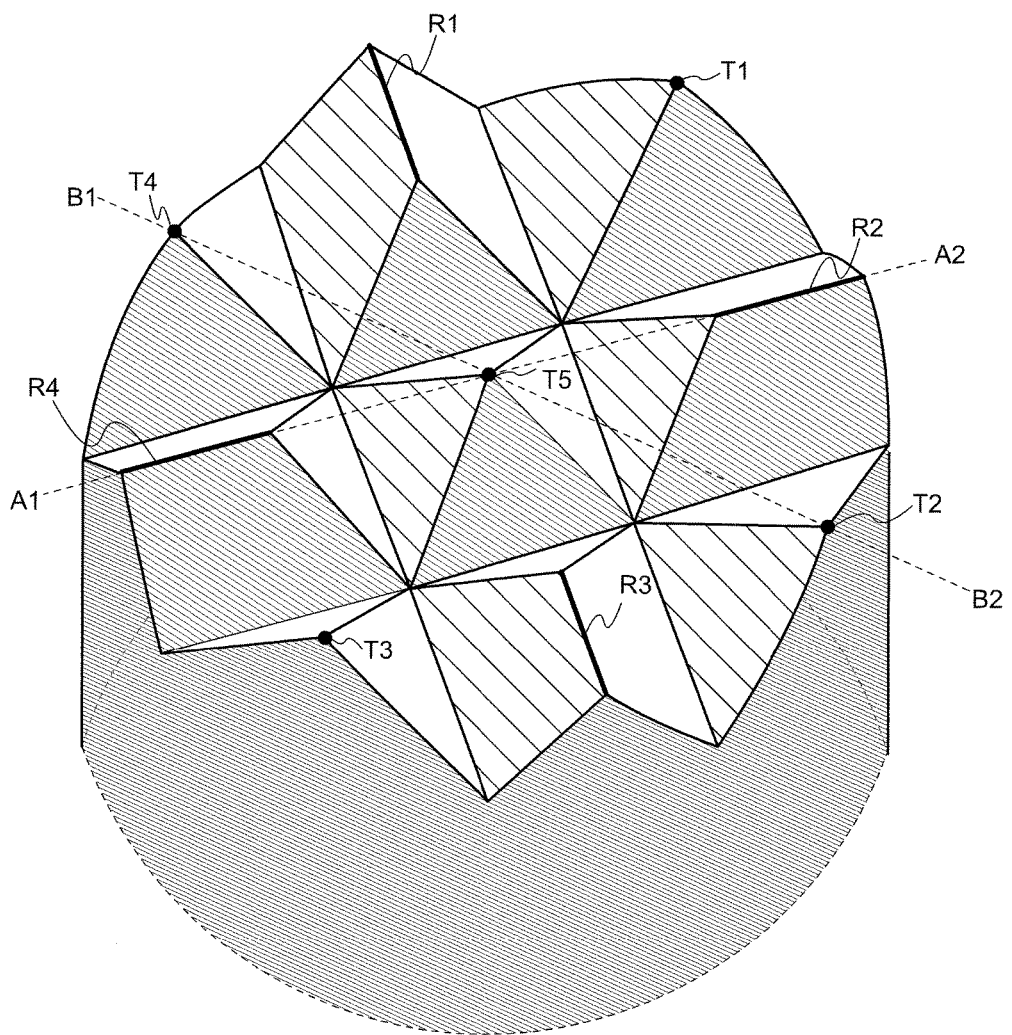
FIG. 8 A perspective view of a conductive probe according to an embodiment of the present invention.
Figure 9A:
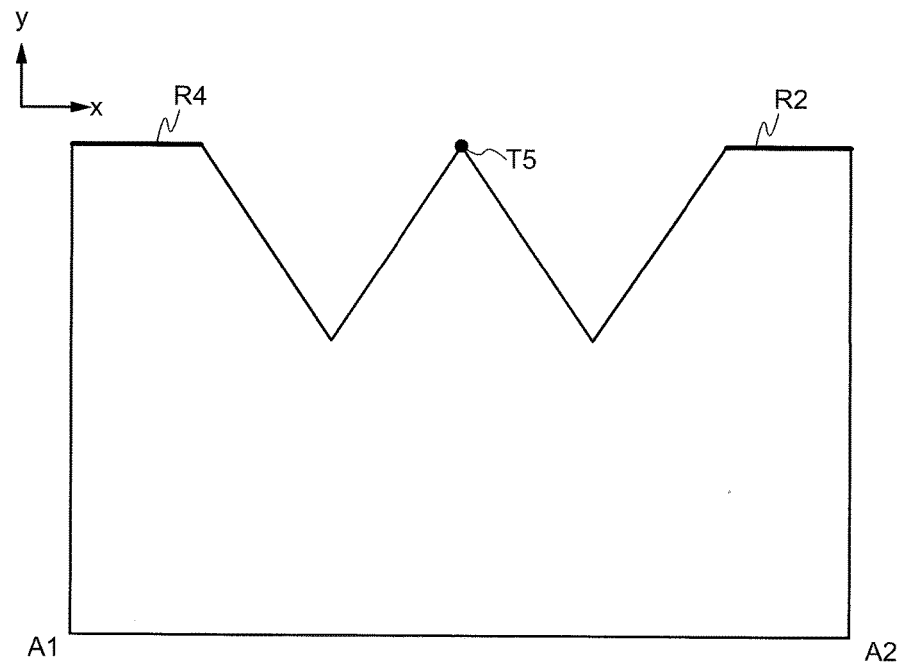
FIG. 9A A cross-sectional view of a conductive probe according to an embodiment of the present invention.
Figure 9B:
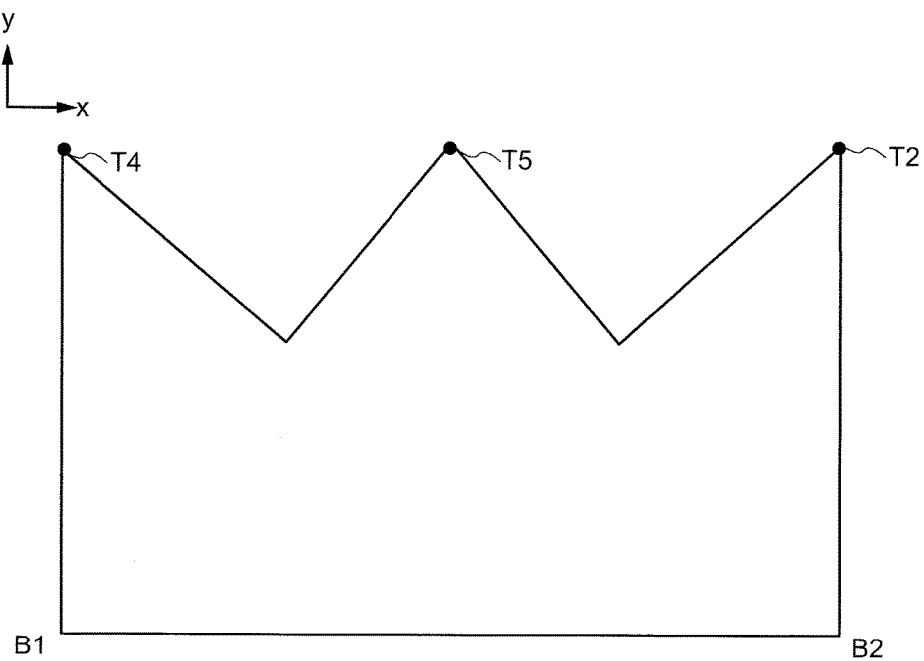
FIG. 9B A cross-sectional view of a conductive probe according to an embodiment of the present invention.

In the present embodiment, a conductive probe having an end-portion shape different from those of the First to Third Embodiments is explained by using FIG. 8, FIG. 9A, and FIG. 9B. FIG. 8 is a perspective view of the first end portion 230 of the conductive probe 110, and FIG. 9A and FIG. 9B are schematic cross-sectional views along dotted lines A1-A2 and B1-B2 shown in FIG. 8, respectively. A description regarding the structures the same as those of the First to Third Embodiments is omitted.

Similar to the First to Third Embodiments, the first end portion 230 of the conductive probe 110 possesses four linear ridges (first to fourth linear ridges) R1 to R4 and five vertexes (first to fifth vertexes) T1 to T5. The first to fourth linear ridges R1 to R4 and the first to fifth vertexes T1 to T5 exist in the same plane.

A difference between the conduct probe 110 of the present embodiment and that of the First Embodiment is that the diameter of the first end portion 230 decreases as approaching the tip in the direction towards the tip and the linear ridges R1 to R4 and the vertexes T1 to T5 are provided at the tip thereof in the latter case, whereas the diameter of the first end portion 230 is constant and the linear ridges R1 to R4 and the vertexes T1 to T5 are provided at the tip thereof in the conduct probe 110 of the present embodiment.

Similar to the First Embodiment, the conductive probe 110 having such an end-portion shape is also able to make contact with an electrode or wiring of an inspection object by using four straight lines and five points as contact portions originating from the plurality of lines of the first to fourth linear ridges and the first to fifth vertexes T1 to T5. Therefore, not only is a more reliable electrical contact feasible, but also abrasion or a nick of the end portion of the conduct probe 110 can be prevented or reduced. Additionally, the end-portion shape of the conduct probe of the present embodiment also has a C4 axis, which allows reduction of the necessity to consider the rotation about the center axis when arranged in the conductive probe unit and improves processability of the conductive probe unit.

Furthermore, when a sphere solder ball is used as an inspection electrode, electrical contact can be achieved by a variety of contact modes although depending on a size of the solder ball. For example, an electrical contact can be accomplished by using a point in the first linear ridge R1, the first vertex T1, and the fifth vertex T5. Hence, a more reliable electrical contact is feasible with an electrode or wiring of an inspection object.

Example

Figure 10:
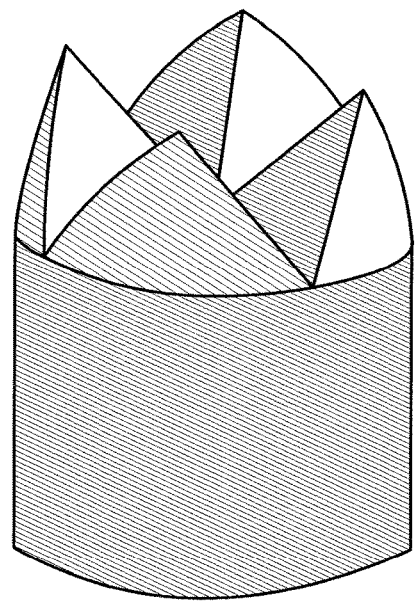
FIG. 10 A perspective view of a conductive probe of Sample 2.

In the present Example, a durability test of the contact probe 110 shown in the Second Embodiment and the results thereof are described. The durability test was carried out by arranging the conductive probe 110 shown in FIG. 4 in the conductive probe unit 120 and pressing a solder-plated metal plate from over the conductive probe 110. After this operation was repeated, the shape of the first end portion 230 of the conductive probe 110 was observed with a scanning electron microscope (SEM) and an amount of abrasion of the end portion was measured (Sample 1). As a reference, the same test was performed on a conductive probe (Sample 2) shown in FIG. 10 which has four vertexes but does not have a linear ridge at an end portion thereof.

Figure 11:
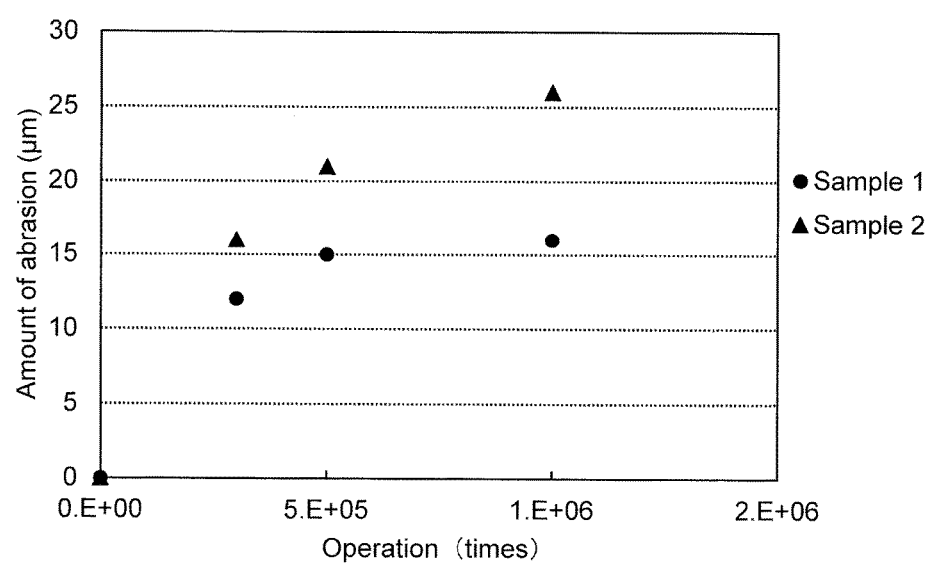
FIG. 11 A result of a durability test of a conductive probe of the Example.

As demonstrated by the results of the durability test in FIG. 11, it was found that the amount of abrasion of the end portion of the Sample 1 is smaller. For example, when the press of the metal plate was conducted $10^6$ times, the amount of abrasion of the Sample 2 having the end portion shown in FIG. 10 exceeded 20 μm, whereas that of the Sample 1 of the conductive probe 110 according to the present invention was approximately 15 μm. Thus, it was confirmed that the conductive probe according to the present invention has high durability to a physical impact and abrasion and a nick of the end portion can be prevented.

The aforementioned modes described as the embodiments of the present invention can be implemented by appropriately combining with each other as long as no contradiction is caused. Furthermore, any mode which is realized by persons ordinarily skilled in the art through the appropriate addition, deletion, or design change of elements or through the addition, deletion, or condition change of a process is included in the scope of the present invention as long as they possess the concept of the present invention.

It is properly understood that another effect different from that provided by the modes of the aforementioned embodiments is achieved by the present invention if the effect is obvious from the description in the specification or readily conceived by persons ordinarily skilled in the art.

DESCRIPTION OF SYMBOLS

100: Semiconductor inspection device
110: Conductive probe
120: Conductive probe unit
140: Circuit substrate
150: Tester
152: Measurement-power source
154: LCR measuring instrument
156: Pulse generator
170: Inspection object
200: First plunger
210: Second plunger
220: Coil spring
230: First end portion
240: Second end portion

The invention claimed is:

1. A conductive probe comprising:
   a first end portion including first to fourth linear ridges and first to fifth vertexes; and
   a second end portion opposing the first end portion,
   wherein the first to fourth linear ridges are spaced from one another and radially extend from an axis passing through the first end portion and the second end portion,
   wherein the first to fourth vertexes are located on an outer circumference of the first end portion and arranged between the first linear ridge and the second linear ridge, between the second linear ridge and the third linear ridge, between the third linear ridge and the fourth linear ridge, and between the fourth linear ridge and the first linear ridge, respectively.

2. The conductive probe according to claim 1, wherein the first to fourth linear ridges are parallel to a direction of a radius of the conductive probe.

3. The conductive probe according to claim 1, wherein the first to fourth linear ridges exist in the same plane as the fifth vertex.

4. The conductive probe according to claim 1, wherein the fifth vertex is located at a cross point of the cross.

5. The conductive probe according to claim 1, wherein the fifth vertex exists in a plane different from that formed by the first to fourth vertexes.

6. The conductive probe according to claim 1, wherein a distance from each of the first to fourth vertexes to the second end portion is smaller than a distance from each of the first to fourth linear ridges to the second end portion in a direction parallel to an axis of the conductive probe.

7. The conductive probe according to claim 1, wherein each of the first to fourth linear ridges is shorter than a radius of the conductive probe.

8. The conductive probe according to claim 1, wherein each of the first to fourth linear ridges reaches the outer circumference of the conductive probe.

9. The conductive probe according to claim 1,
   wherein the first to fourth linear ridges exist in the same plane as the first to fourth vertexes, and
   wherein the plane is parallel to a direction of a radius of the conductive probe.

10. The conductive probe according to claim 1, wherein the fifth vertex exists in a plane formed by the first to fourth vertexes.

11. A conductive probe unit comprising the conductive probe according to claim 1.

12. A semiconductor inspection device comprising the conductive probe unit according to claim 11.

13. The conductive probe according to claim 1, wherein the first and third linear ridges extend along a first straight line, and the second and fourth linear ridges extend along a second straight line.

14. The conductive probe according to claim 13, wherein the first straight line and the second straight line intersect at the axis passing through the first end portion and the second end portion.

* * * * *